United States Patent [19]

Brown et al.

[11] Patent Number: 4,460,223
[45] Date of Patent: Jul. 17, 1984

[54] COVER FOR CHIP CARRIER SOCKET

[75] Inventors: Vincent B. Brown, Prospect Heights; Robert F. Schlacks, Mount Prospect, both of Ill.

[73] Assignee: Methode Electronics, Inc., Chicago, Ill.

[21] Appl. No.: 335,801

[22] Filed: Dec. 30, 1981

[51] Int. Cl.³ .............................................. H01R 23/72
[52] U.S. Cl. ............................ 339/14 R; 339/17 CF; 339/75 MP
[58] Field of Search ............. 339/14 R, 17 CF, 75 M, 339/75 MP, 176 MP

[56] References Cited

U.S. PATENT DOCUMENTS

| 4,278,311 | 7/1981 | Scheingold et al. | 339/17 CF |
| 4,341,433 | 7/1982 | Cherian et al. | 339/17 CF |
| 4,345,810 | 8/1982 | Bakermans | 339/17 CF |
| 4,357,720 | 10/1982 | Bakermans | 339/17 CF |
| 4,389,080 | 6/1983 | Clark et al. | 339/14 R |

Primary Examiner—John McQuade
Attorney, Agent, or Firm—Charles F. Pigott, Jr.

[57] ABSTRACT a cover assembly for a leadless chip carrier socket including a spring cover and locking bracket selectively positionable on a socket body in any one of four positions. The spring cover is pivotally mounted on the socket body and is movable between an open position and a closed position at which the cover engages the locking bracket. The cover is formed with four arm members which are spring loaded and which engage the top of a chip carrier at eight pressure points. The force exerted by the spring cover in a closed position applies a downward force against the chip package to effect positive electrical contact with a plurality of contacts mounted in the socket which are adapted to be interconnected with a printed circuit board or circuit pad.

17 Claims, 12 Drawing Figures

U.S. Patent   Jul. 17, 1984   Sheet 1 of 3   4,460,223
FIG. 1
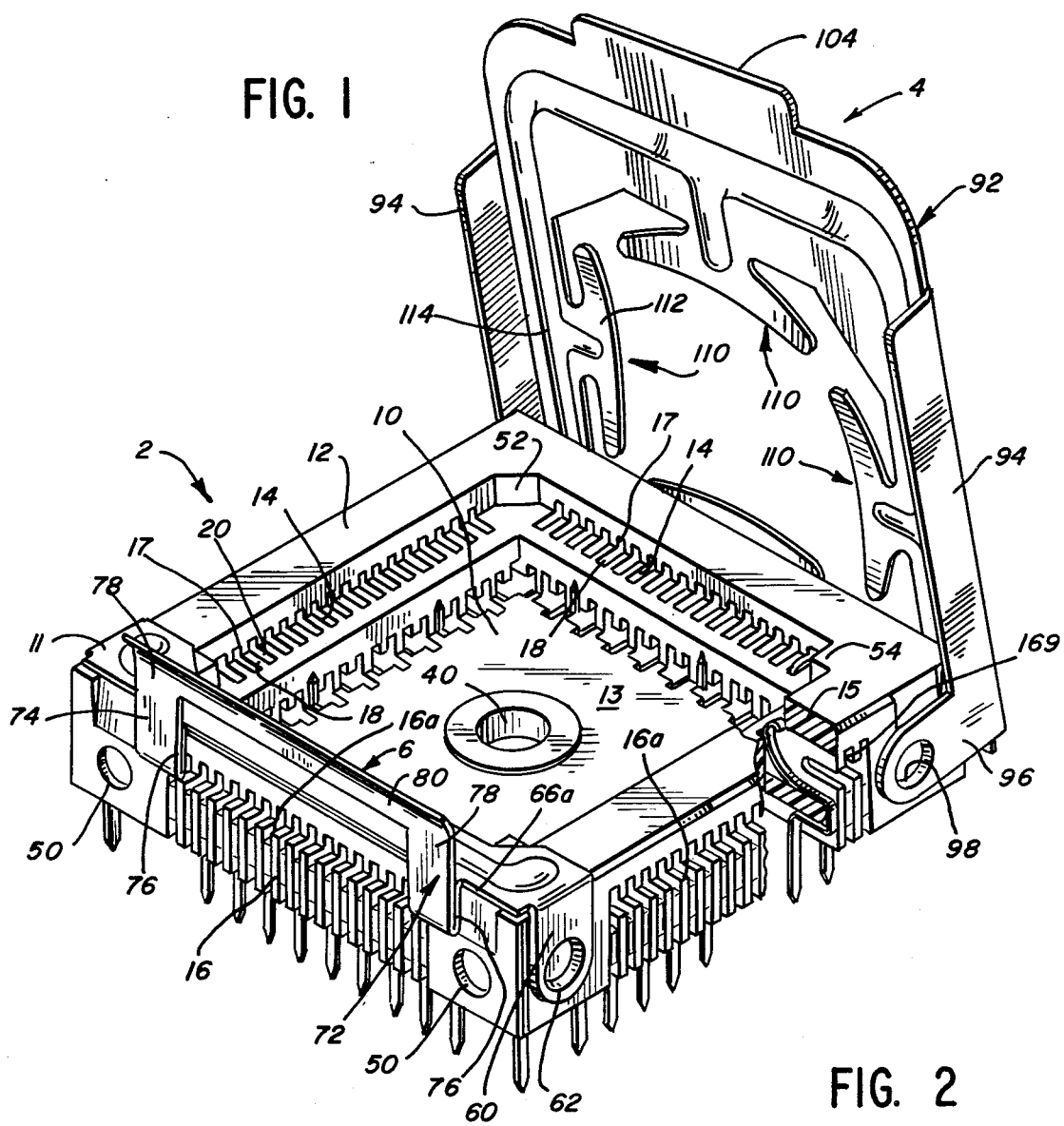
FIG. 2
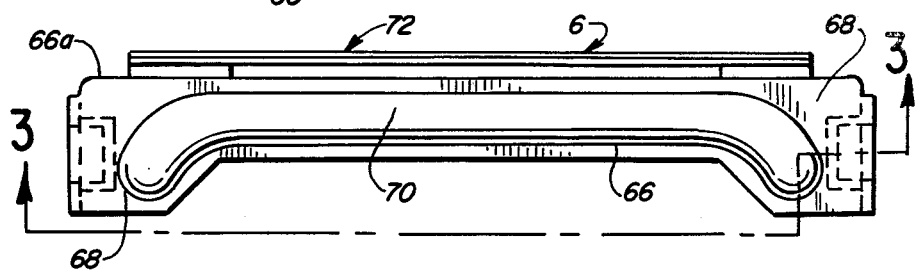
FIG. 4
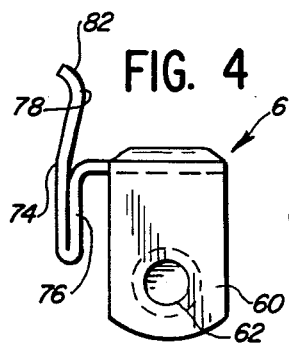
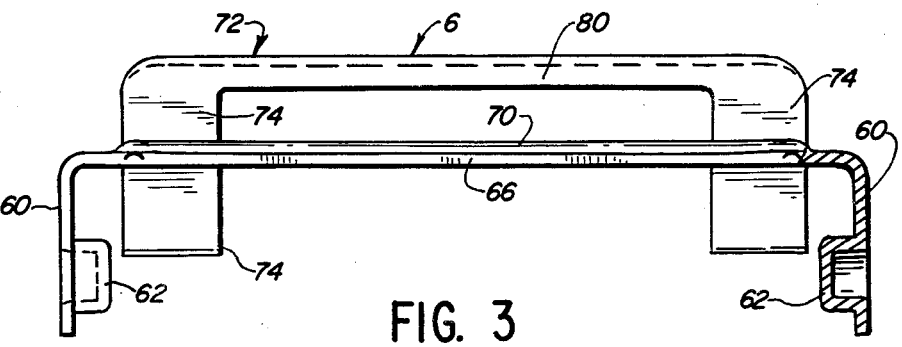
FIG. 3

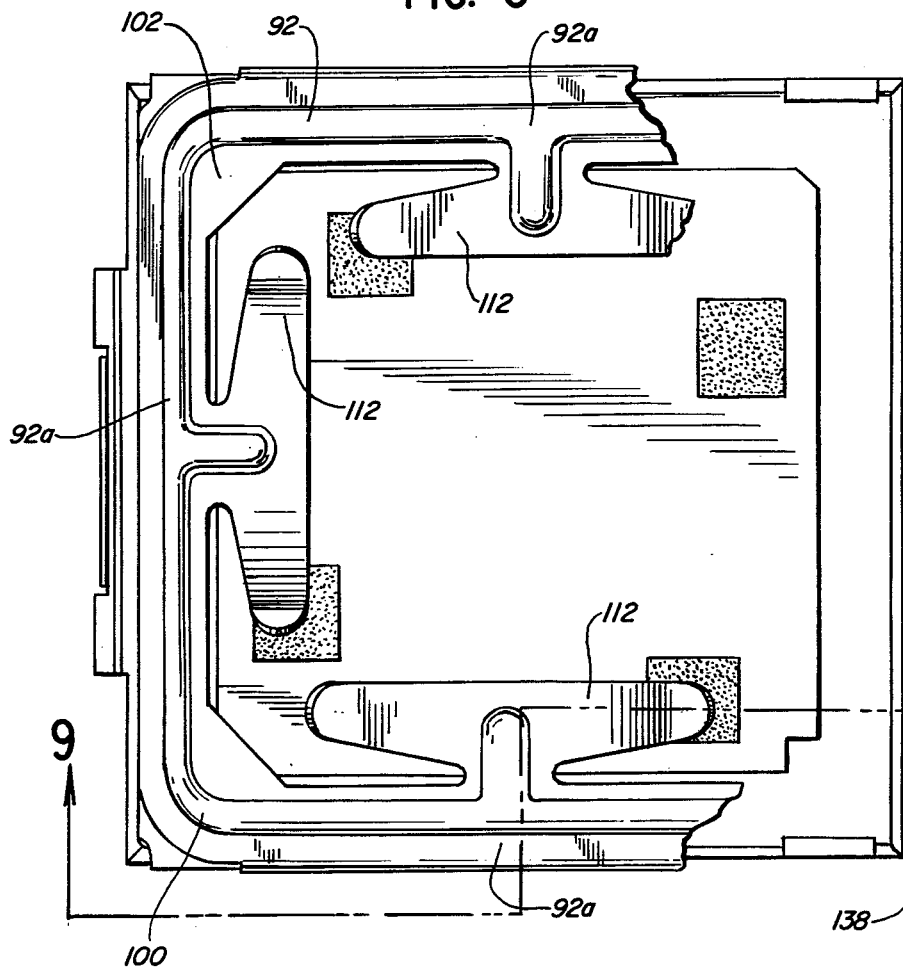
FIG. 8
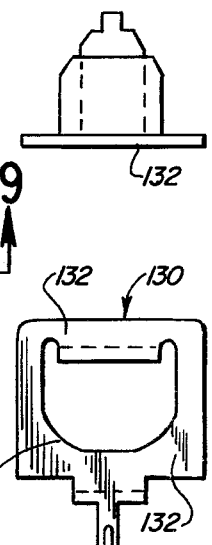
FIG. 10
FIG. 11
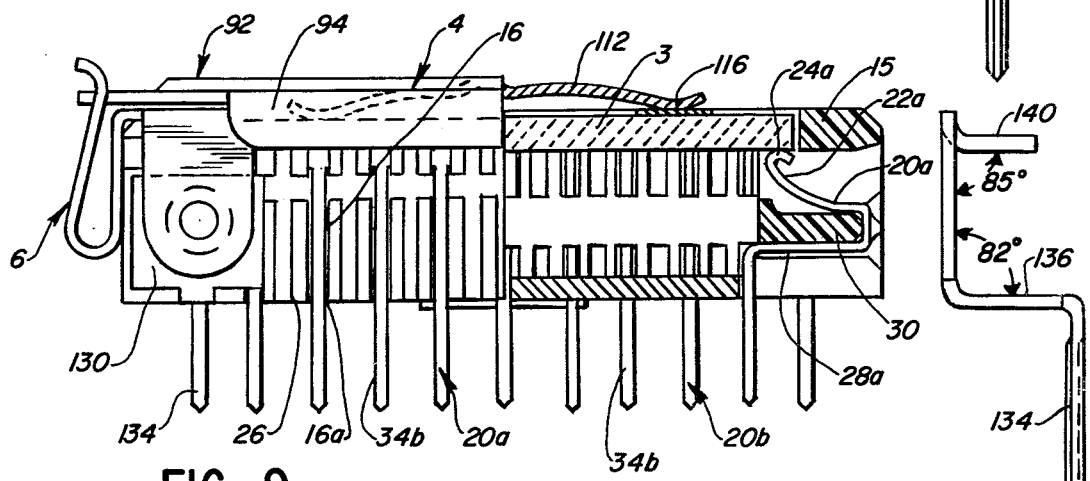
FIG. 9
FIG. 12

COVER FOR CHIP CARRIER SOCKET

BACKGROUND OF THE INVENTION

This invention relates in general to electrical connectors and, in particular, to a socket for a leadless chip carrier or package.

More specifically, the invention relates to an improved cover assembly and locking bracket selectively attachable to a chip carrier socket at any one of four positions as required in various applications. The cover assembly is provided with means to apply a force to a chip carrier within a carrier socket for uniform and positive connection with the contact means therein.

In many electrical circuit designs, a leadless, semiconductive chip package is interconnected with a printed circuit board or circuit pad by means of a carrier socket. Carrier sockets of this type conventionally include a base receptacle in which the circuit package is inserted for interconnection with a pad. The base receptacle of a socket is provided with an upper access opening to permit insertion and removal of the chip carrier from the socket as needed. A cover assembly is typically mounted on the socket in association with the access opening to engage the chip carrier and, when closed, applies a force on the chip body and biases it against the contacts of the carrier socket. In some prior designs, the chip is depressed downward in a manner that it is resiliently captured between yieldable members. The "floating" effect of such prior techniques does not provide a desirable degree of positive and uniform contact between the carrier and the plurality of contacts arranged within the socket carrier. In addition, it is advantageous that the force exerted on the chip package by the cover not only be discretely applied to protect the components, but also be of a sufficient magnitude to attain a positive connection with the number of contacts within the socket. Prior designs in general have not functioned in a manner to apply a distributed force against the chip package to attain a uniform and effective connection with the socket contacts, while protecting the components.

Because a carrier socket may be employed in a wide range of applications, many prior cover assemblies are also disadvantageously limited to one, or perhaps two, attachment positions on the socket. The carrier socket is a polarized component as is the chip carrier itself. Because the chip carrier must then be properly aligned in the socket and the socket must be appropriately oriented on the board, such limitations of the relative positioning of the elements can be inconvenient to the user, since physical conditions may not permit opening or closing of the cover in the limited direction dictated by prior designs.

Many prior carrier sockets suffer from other shortcomings which interfere with their effectiveness and convenience of use. A cover assembly, for example, applies a significant force to the chip carrier, and must be locked by an effective mechanism capable of being easily locked and unlocked with a minimal force being applied to the components. Locking techniques in the past fail to incorporate both the characteristics of ease of use with effectiveness of locking and protection to the elements. In addition, known sockets do not offer a simple and inexpensive technique by which the cover assembly and/or latch may be electrically grounded, a consideration to avoid cross-talk between contacts, particularly a problem in high speed functions.

In view of the foregoing shortcomings of known techniques and other problems not specifically enumerated, a significant need exists for an improved cover assembly and locking means for a chip carrier socket capable of overcoming many of the problems associated with the prior art.

SUMMARY OF THE INVENTION

It is, therefore, an object of this invention to provide an improved cover assembly and locking bracket for a chip carrier socket.

Another object of this invention is to improve the application of force being exerted by a cover assembly against a chip carrier within a socket.

A further object of this invention is to provide a cover assembly capable of being attached to a chip carrier socket at a plurality of selected positions.

Still another object of this invention is to provide an improved locking bracket to minimize the application of force to a chip carrier socket during latching and unlatching operations.

A still further object of the invention is to provide an effective device for electrically grounding the cover assembly and locking bracket of a chip carrier socket.

These and other objects are attached in accordance with the present invention wherein there is provided an improved cover assembly and latching bracket for a chip carrier socket that is capable of being connected to a printed circuit board or circuit pad by any well-known technique, such as, for example, by soldering or pressure contact. The cover assembly herein disclosed includes a plurality of resiliently mounted arm members to apply a downward force to a chip carrier at a plurality of discrete points for uniform mechanical and electrical contact with the contact means of the socket receptacle. The cover assembly and associated locking bracket of the invention may be selectively attached to the socket at any one of four positions to allow the user to choose the direction in which the cover opens.

DESCRIPTION OF THE DRAWINGS

Further objects of the invention together with additional features contributing thereto and advantages accruing therefrom will be apparent from the following description of preferred embodiments of the invention, which are shown in the accompanying drawings with like reference numerals indicating corresponding parts throughout wherein:

FIG. 1 is a side perspective view of the improved cover and locking bracket of the invention shown in an open configuration on a leadless chip carrier socket;

FIG. 2 is a top schematic view of the locking bracket of FIG. 1;

FIG. 3 is a back schematic view, with parts in section, taken along line 3—3 of FIG. 2;

FIG. 4 is an end schematic view of the locking bracket of FIG. 2;

FIG. 8 is a top schematic view, with parts cut away of improved cover assembly and latching bracket of FIG. 1, in a closed configuration;

FIG. 9 is a side schematic view, with parts in section, taken along 9—9 of FIG. 8;

FIG. 10 is a top schematic view of the electrical grounding lug of the invention;

FIG. 11 is a front schematic view of the electrical grounding lug of FIG. 10; and FIG. 12 is a side schematic view of the electrical grounding lug of FIG. 10.

DESCRIPTION OF A PREFERRED EMBODIMENT

Figure 5:
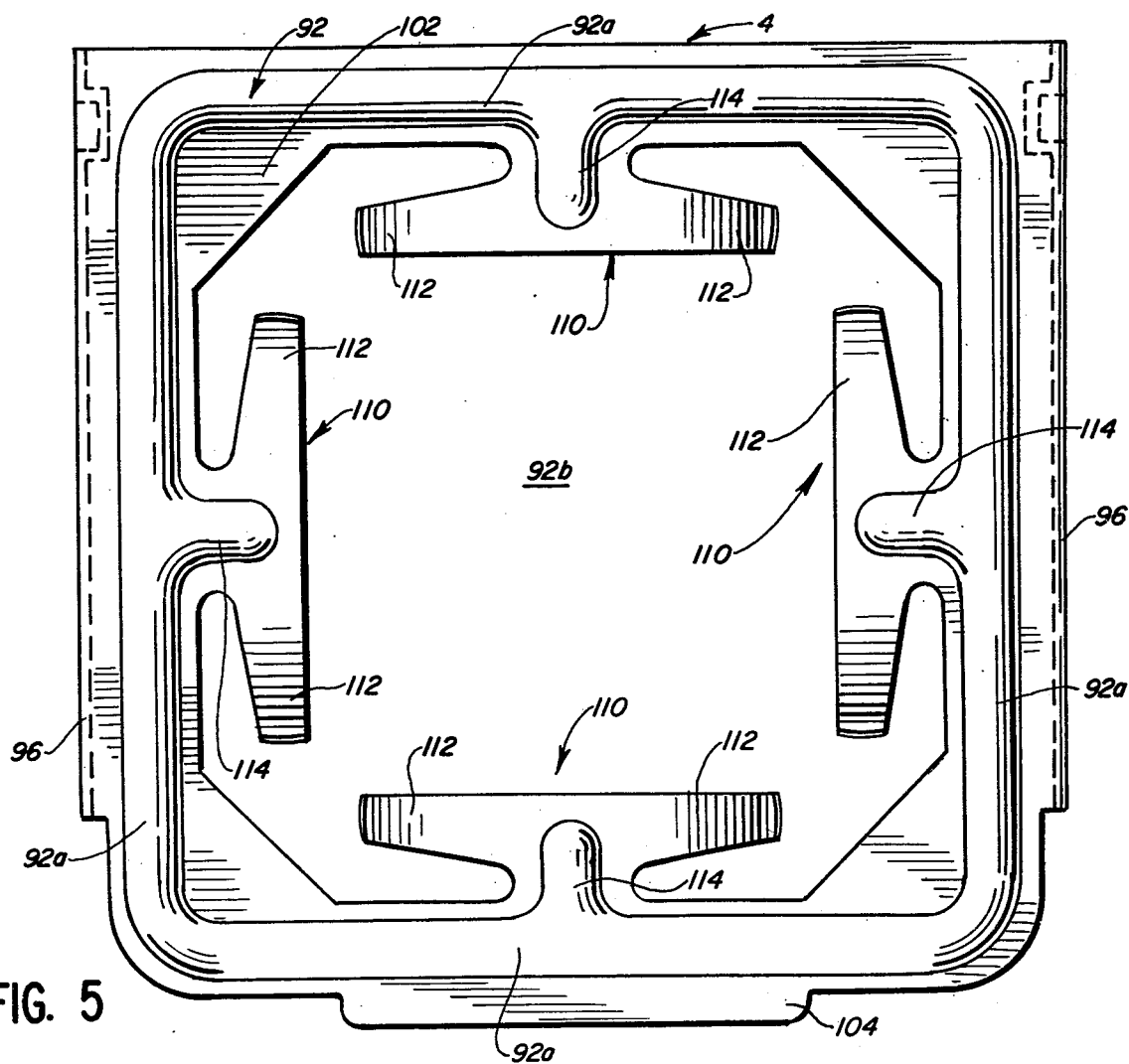
FIG. 5 is a top schematic view of the cover assembly of FIG. 1.

Referring now to FIG. 1 there is illustrated a chip carrier socket 2 having the improved cover assembly 4 and locking bracket 6 of the invention. The chip carrier socket 2 acts as a connector through which a semi-conductive chip carrier or package 3 mounted therein is connected to a printed circuit panel or circuit pad (not shown). Although the cover assembly and locking bracket herein disclosed may be equally used with other carrier sockets, such as the well-known pressure or surface compression type and the like, the chip carrier socket 2 is shown as being of a solder type design which will be apparent from the following discussion.

The chip carrier socket 2 forms an upwardly opening receptacle 10 having a rectangular configuration defined by enlarged corner sections or posts 11 interconnected by four upright side walls 12 and a bottom wall 13. The socket 2 may be constructed from a suitable molded material and the like such as, for example, an electrically insulative plastic material. An upward facing shoulder or ledge 14 is formed on all four sides within the square receptacle 10 around its outer periphery or edge. As best shown in FIG. 1, side walls 12 include a continuous upper portion 15 and a lower plurality of parallel plate-like sections 16. The areas 16a between the plates 16 form contact compartments which open at the bottom and outside of the socket body and open in receptacle 10 through apertures 17 disposed in upper portion 15 immediately above ledge 14.

A plurality of apertures 18 are further provided through ledge 14 in open alignment with apertures 17. Apertures 17 and 18 provide openings through which a portion of the carrier socket may establish mechanical and electrical contact with a chip carrier. A leadless chip carrier or package 3 (partially shown in FIGS. 8 and 9), generally comprising a conventional semi-conductor chip circuit mounted on a substrate and suitable for micro processing applications and the like, is adapted to be positioned within the receptacle 10 to effect electrical and mechanical contact between the peripheral edges of the chip package and a plurality of electrically conductive contacts 20.

Although the cover assembly and locking bracket of the invention may be used in other chip carrier sockets, such as a compression type and the like, and with other specific contact designs other than herein disclosed, in FIGS. 1 and 9 two types of contacts 20a and 20b, formed from a conductive elongated material in the form of a metal are shown. Contacts 20a and 20b extend vertically from a position adjacent apertures 17 and 18 and terminate at exterior terminal ends for attachment to the circuit by soldering. The contacts 20a and 20b are vertically separated from each other by the plurality of vertical sections 16 forming a portion of side walls 12 as best shown in FIGS. 1 and 9.

The rectangular array of terminal pins 34a and 34b are adapted to pass through pin apertures in a pad (not shown). The solder tails thereof are then soldered to the underside of the pad having a suitable circuitry, sometimes known as a foot print, to effect an electrical connection therebetween. In many pads a foot print is positioned on both sides of the panel.

Each of the corner posts 11 of the carrier socket includes a pair or mounting holes 50 on its outer surfaces, providing two holes at each end of the four sides of the socket. One of the corners 52 of the receptacle 10 possesses a beveled shape in the vertical section above ledge 14, as opposed to an approximate square configuration at the other three corners 54. This corner arrangement insures that the chip carrier is properly aligned within the socket during insertion, since both components are normally polarized.

Referring now to FIGS. 1, 2, 3 and 4 the cover locking bracket 6 is best illustrated. The locking bracket 6 may be formed from a metal material and the like and includes a pair of opposite, downwardly extending support arms 60 on which inwardly projecting hollow bosses 62 are formed. Pivots 62 have an outer configuration to match the holes 50 and are adapted to be inserted in opposite aligned holes 50. The pivots 62 are capable of being releasably snapped into and from position therein as desired by limited deformation of the arms 60. The spaced arms 60 are interconnected by a cross member 66 having enlarged end portions 68, which are integrally attached to a respective arm 60. The cross member 66 may be formed with a strengthening rib 70 as best shown in FIGS. 2 and 3.

The outer edge 66a of cross member 66 is designed to project slightly beyond the outer surface of the socket to permit a latching structure 72 to integrally depend downwardly therefrom and then upwardly above the socket. The latching assembly 72 includes a pair of lock bar support arms 74 comprising a pair of lower segments 76 formed by bending back two segments as a double thickness, and a pair of upper sections 78 projecting therefrom above the cross member 66. An elongated element or bar 80 integrally connects the pair of the lock bar support arms 74. As shown in FIG. 3, the upper edge portion of latching assembly 72 curves outwardly to form a cam surface 82 for cooperative action with the cover assembly 4 as will be described. It should be apparent that the locking bracket 6 (FIG. 4) is capable of only limited pivotal movement in a direction radial of the center of the socket, because of the close proximity of segments 76 of the latching structure 72 and the carrier socket.

Figure 6:
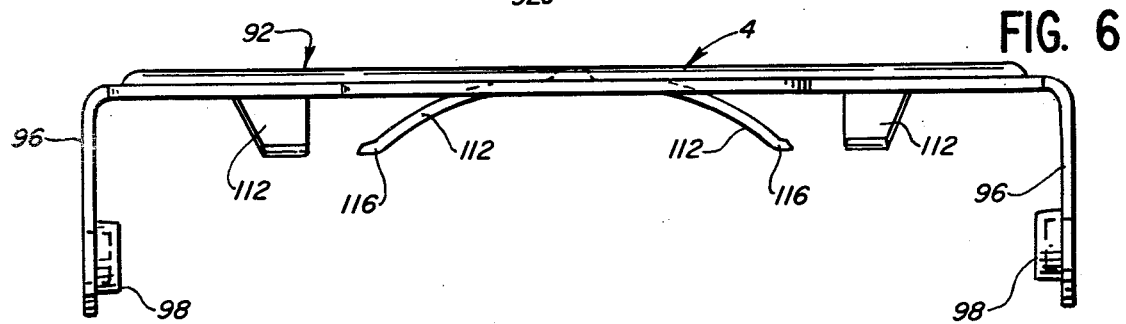
FIG. 6 is an end schematic view of the cover of assembly of FIG. 5.
Figure 7:
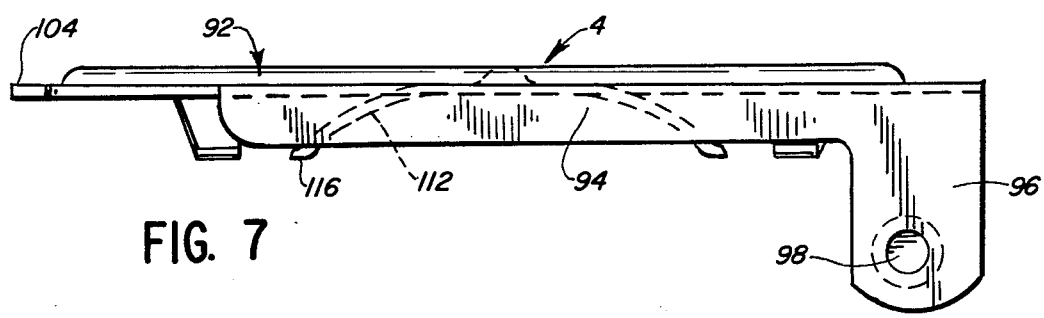
FIG. 7 is a side schematic view of the cover assembly of FIG. 5.

Referring now to FIGS. 5, 6 and 7, details of the cover assembly 4 are best illustrated. The cover assembly 4 includes a four sided rectangular frame 92 created by four interconnected sides 92a that define a central opening 92b. A pair of side panels 94 integrally depend downwardly from an opposite pair of frame sections 92a and are provided with a pair of cover pivot arms 96 adjacent one side of the cover frame 92 as best shown in FIGS. 1 and 7. The side panels 94 are disposed adjacent the outer surface of socket side walls 12 in a closed configuration of the cover assembly as partially illustrated in FIG. 9. An inwardly projecting pivot 98 is formed on each of the cover pivot arms 96 and is of the same design as the pivot members 62 of the locking bracket 6. The pivot members 98 are adapted to be releasably inserted in a aligned pair of holes 50 on opposite sides of the carrier socket body, and at the opposite side of the socket from the mounting of the latching bracket 6. Thus, the locking bracket 6 and cover assembly 4 may be selectively mounted in any one of four separate positions on the carrier socket 2. Such versatility of mounting thus permits the cover to open in any one of four different directions as may be necessary or desirable in numerous application.

A continuous rib 100 is provided around the four sections 92a of the cover frame 92. The cover frame 92 is further strengthened by beveled areas 102 disposed at each of the corners interconnecting the four cover frame sections. A locking lip 104 projects outward from the particular frame section 92a, which is situated opposite to the mounting of the cover pivot arms, and is designed to engage the underside of the locking bar 60 in a locked configuration. Locking engagement is automatically effected during closing of the cover assembly by contact of the lip 104 with the cam surface 82 of the locking bracket 6 to pivot it outward. Release of the cover is simply accomplished by manually moving the locking bracket away from the engaged position of the lip 104 under locking bar 60.

Four spring members on brackets 110 symmetrically project into the central opening 92b within the four sections of the cover frame 92. Each of the spring brackets 110 comprises a pair of curved resilient spring members 112, which function as cantilever beams or arms, and are centrally supported on a cover frame 92a by a base projection 114. The spring members 112 of each spring bracket 110 bend downward from the base 114 in opposite directions as best shown in FIG. 6 and terminate at a free end portion 116 at which end of the spring members applies a resilient force to a chip carrier mounted in the socket receptacle 10 upon closing and locking of the cover assembly 4.

When a chip carrier is inserted into the socket receptacle 10 and the cover assembly is closed and locked as shown in FIGS. 8 and 9, the cover assembly applies a downward force on the back of the chip at eight points of contact about a common center. This symmetrically applied force is greater than the total force generated on the bottom of the chip carrier by the plurality of contacts 24a and 24b protruding above shoulder 14. According, the contacts 24a and 24b are resiliently depressed and the chip carrier is caused to press directly against the shoulder 14 to attain an efficient mechanical and electrical connection with the contacts. This cooperative action further insures that the contacts 20a and 20b are not mechanically overloaded. It should be also noted that the cover assembly is capable of accommodating a heat sink extending up from the back side of chip carrier as needed in certain applications. Because a heat sink can project upward beyond the socket and cover, actual pivotal movement of the cover is then impeded. This problem is avoided in the present invention, because the cover assembly 4 can be vertically moved relative to the heat sink to be snapped into position on the socket body or removed in the opposite manner.

The chip carrier socket herein disclosed is also capable of electrically grounding the cover assembly 4 or the locking brackets 6, or both components, with conductive metal lugs 130. Four separate lugs 130 are required to ground both the cover assembly and locking bracket, but only two lugs 130 are employed in the socket illustrated in FIGS. 1, 8 and 9 to ground the cover assembly. The lugs 130 include a flat upper body portion 132 which mounts beneath the pivot arms 96 of the cover assembly 4, or alternatively beneath support arms 60 of the locking bracket 6, if that component is grounded. The body 132 is integrally connected to a lower projection 134 adapted to be inserted into the ground hole (not shown) formed through socket body 2 for connection to a grounding circuit. To effect proper alignment of the lower projection 134 with the socket ground hole, projection 134 is disposed inward of the lug body 132 through an intermediate integral section 136, as best shown in FIG. 12.

The lug body 132 is constructed with central opening 138, allowing the pivot bosses 98 of the cover assembly, or of the locking bracket, to project through opening 138 into a socket hole 50. An upper projection 140 extends at an approximate right angle to the lug body at the upper edge of opening 138 for insertion into holes 50 in contact with the pivots of the cover assembly or locking bracket. The vertical height of the opening 138 is selected to be of a magnitude to cause the pivot bosses 62 or 98 to engage the lug body at projection 140, while the pivot members 62 and 98 are snapped into place in holes 50. Accordingly, electrical contact between the cover assembly 4, or the locking bracket 6, and lug 130 is effected to ground either of the components through the lug body to a grounding circuit.

While the invention has been described with reference to a preferred embodiment, it will be understood by those skilled in the art that various changes may be made and equivalents may be substituted for elements thereof without departing from the scope of the invention. In addition, many modifications may be made to adapted a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A chip carrier socket comprising:
    receptacle means having a plurality of electrical contacts adapted to be interconnected with an electrical circuit;
    said receptacle means forming a rectangular receptacle having an upper access opening for receiving a leadless chip carrier for connection with the electrical circuit;
    said receptacle means further forming an upwardly facing surface within said receptacle for engaging a portion of the chip carrier element inserted therein;
    said receptacle means further including means for creating an electrical connection between a portion of said plurality of electrical contacts and the active chip carrier in engagement with said surface;
    cover means having four intersecting sides being pivotally mounted on said receptacle means for movement between an open position and a closed position over said upper opening to said receptacle;
    bracket means mounted on said receptacle means for locking said cover means in said closed position and for releasing said cover means from said closed position;
    said cover means having a plurality of resilient spring members to apply a force to the chip carrier in said closed position;
    said plurality of spring members acting to apply a force at plurality of discrete points to press the chip carrier in positive contact with said receptacle surface in electrical contact with said portion of said electrical contacts;

said spring members are in the form of a plurality of resilient cantilevered arms;

said plurality of cantilevered arms curve downward into said receptacle from said cover means to apply a force to the chip carrier within the receptacle at their respective free ends;

said plurality of cantilevered arms are arranged as separate pairs of arms, a base projection being carried at an intermediate portion of each of said four sides, each of said pairs being supported by a respective one of said base projections and being positioned symmetrically on said cover means with the free ends of said pair extending in opposite directions from said base projection to contact the chip carrier at discrete points and apply a force thereto about a common center.

2. The chip carrier socket according to claim 1 wherein said portion of said electrical contacts extend upward beyond said surface in absence of a chip carrier within said receptacle.

3. The chip carrier socket according to claim 2 wherein said portions of said electrical contacts are resiliently deformed in contact with the chip carrier by the force exerted by said cover means in said closed position.

4. The chip carrier socket according to claim 3 wherein the force exerted by said cover means on the chip carrier is greater than the force exerted thereon by said plurality of contacts.

5. The chip carrier socket according to claim 1 further including means to electrically ground said cover means and said locking bracket means.

6. The chip carrier socket according to claim 5 wherein said electrical ground means includes at least one pair of conductive lug members in electrical contact with either one or both of said cover means and said bracket means.

7. A cover assembly and locking bracket for a chip carrier socket comprising:
cover means adapted to be mounted adjacent an upper access opening of a chip carrier socket;
said cover means having a cover member formed by a continuous frame portion having four sides and defining a central opening in said cover member;
a pair of pivot arms for mounting said cover member on the carrier socket for pivotal movement between an open and closed position;
said cover member having a plurality of cantilevered spring members depending therefrom and adapted to extend into the access opening to a position beneath said cover member;
a base portion carried by each of said four sides at an intermediate position thereof, and each of said base portions supporting a pair of cantilevered spring members having free ends disposed in opposite directions therefrom, the free ends of each pair of cantilevered arms arranged to contact the chip carrier at two discrete points in a closed position of said cover member;
said spring members arranged to apply a force to a chip carrier positioned in the socket in said closed position of said cover member; and
a locking bracket adapted to be mounted on the carrier socket and arranged for limited movement for engaging a portion of said cover member for the locking thereof in said closed position and for releasing said cover member from said closed position.

8. The cover assembly and locking bracket of claim 7 wherein said base portions extend from each of said four sides into said cover opening.

9. The cover assembly and locking bracket according to claim 7 wherein said locking bracket is pivotally movable in a direction extending radially outward from the center of said cover member to minimize the forces applied thereto during locking and unlocking.

10. The cover assembly and locking bracket according to claim 7 further comprising at least one pair of electrically conductive lug members to ground at least either of said cover member or said locking bracket, said lug members being mounted in electrical contact with a portion of said cover member or said locking bracket.

11. The cover assembly and locking bracket according to claim 10 wherein each of said lug members includes a respective opening through which a portion of either said cover means or said locking bracket extends.

12. The cover assembly and locking bracket according to claim 10 wherein each of said lug members includes a projecting member extending into the socket in contact with a portion of the cover means or said locking bracket.

13. The cover assembly and locking bracket according to claim 7 wherein said central opening is arranged between said spring members to permit a heat sink associated with the chip carrier to protrude upward through said central opening.

14. The cover assembly and locking bracket according to claim 13 further including means for selectively attaching and detaching the pivot arms from their mounting on said carrier socket to permit movement of said cover member between an open position and a closed position in the presence of a heat sink.

15. A chip carrier socket comprising:
receptacle means having a plurality of electrical contacts adapted to be interconnected with an electrical circuit;
said receptacle means having a plurality of flat intersecting external walls forming four corners and forming a receptacle having an upper access opening for receiving a leadless chip carrier for connection with the electrical circuit;
said receptacle means further forming an upwardly facing surface within said receptacle for engaging a portion of the chip carrier element inserted therein;
said receptacle means further including means for creating an electrical connection between a portion of said plurality of electrical contacts and the active chip carrier in engagement with said surface;
cover means pivotally mounted in any one of four positions on said receptacle means for movement between an open position and a closed position over said upper opening to said receptacle;
said cover means having a lip portion for locking said cover means;
bracket means mounted on said receptacle means to selectively engage said lip portion for locking said cover means in said closed position and for releasing said cover means from said closed position;
said cover means having a plurality of resilient spring members to apply a force to the chip carrier in said closed position;
said plurality of spring members acting to apply a force at plurality of discrete points to press the chip carrier in positive contact with said receptacle surface in electrical contact with said portion of said electrical contacts;

said bracket means being pivotally mounted on said receptacle means for locking and releasing said cover means;

said bracket means including a bar movable from a position above said lip portion in engagement therewith in closed position and movable away from said lip during pivotal movement of said bracket means for releasing said cover means;

said receptacle having a plurality of holes on each side adjacent each intersecting corner of said sides;

said bracket means having insertion means for releasably engaging two holes respectively on selected opposed sides of said receptacle;

said bar having integral arms carrying means to engage two of the other holes on said selected opposed sides.

16. The chip carrier socket according to claim 15 wherein said receptacle means includes means for mounting said cover means and said bracket means at one of a plurality of selected positions to permit said cover means to move between said open and said closed position in one of a plurality of directions.

17. The chip carrier socket according to claim 16 wherein said mounting means is arranged to mount said cover means and said bracket means for pivotable movement at one of four discrete positions.

* * * * *